United States Patent [19]

Chea, Jr.

[11] 4,150,368
[45] Apr. 17, 1979

[54] SIGNAL CODING FOR COMPRESSED PULSE CODE MODULATION SYSTEM

[75] Inventor: Ramon C. W. Chea, Jr., Monroe, Conn.

[73] Assignee: International Telephone and Telegraph Corporation, New York, N.Y.

[21] Appl. No.: 813,434

[22] Filed: Jul. 7, 1977

[51] Int. Cl.$^2$ .................. H03K 13/02; H03K 13/20
[52] U.S. Cl. .................. 340/347 C; 340/347 AD; 340/347 DA
[58] Field of Search ... 340/347 M, 347 AD, 347 DA, 340/347 C; 179/15 A; 325/38 R

[56] References Cited

U.S. PATENT DOCUMENTS

| | | | |
|---|---|---|---|
| 2,817,704 | 12/1957 | Huntley | 340/347 C |
| 3,281,828 | 10/1966 | Kaneko | 340/347 M |
| 3,333,262 | 7/1967 | Orsen | 340/347 M |
| 3,445,839 | 5/1969 | Engelberg | 340/347 M |
| 3,487,304 | 12/1969 | Kennedy | 340/347 M |
| 3,493,963 | 2/1970 | Schluter | 340/347 M |
| 3,534,257 | 10/1970 | Charap | 340/347 M |
| 3,594,765 | 7/1971 | Lerouge | 340/347 M |
| 3,993,992 | 11/1976 | Zwack | 340/347 C |
| 4,034,294 | 7/1977 | Dalley | 340/347 AD |

OTHER PUBLICATIONS

Bares "IBM Technical Disclosure Bulletin", vol. 10, No. 9, Feb. 1968, pp. 1372-1373.
Peled "IBM Technical Disclosure Bulletin", vol. 18, No. 8, Jan. 1976, pp. 2686-2688.
Harknett "Electronic Engineering", Feb. 1972, pp. 30-35.

Primary Examiner—Charles D. Miller
Attorney, Agent, or Firm—James B. Raden; Donald J. Lenkszus

[57] ABSTRACT

A codec including an encoder section for encoding analog signals in compressed PCM (CPCM) and a decoder section for decoding CPCM information into analog signals features a single companding generator shared by the encoder and decoder sections. In the encoder section, an analog signal to be encoded is sampled periodically and the analog samples are compared with the decaying voltage of the companding generator which includes a capacitor, which is initially charge to a fixed voltage E. The capacitor is then discharge through a fixed resistance to another fixed voltage -dE, the discharge time being measured by a binary digital encoder counter from the start of the discharge until the voltage on the capacitor equals the absolute value of the given analog signal sample, at which time the count of the binary counter represents the desired compressed pulse code of the analog signal samples magnitude. Additionally, a sign bit, derived from the analog signal sample, indicates the polarity of said sample. In the decoder section, a CPCM input signal to be decoded is loaded into a decoder counter, which is decremented to a zero count, while the decaying voltage of the companding generator is sampled. The resultant sample represents the magnitude of the analog signal output for the decoded CPCM code, either directly or inverted, depending upon the sign bit. This sampled signal is further presented to a low-pass filter at a predetermined interval of the codec operating cycle dictated by the sampling frequency. The output of low-pass filter is the desired reconstructed analog signal.

13 Claims, 6 Drawing Figures

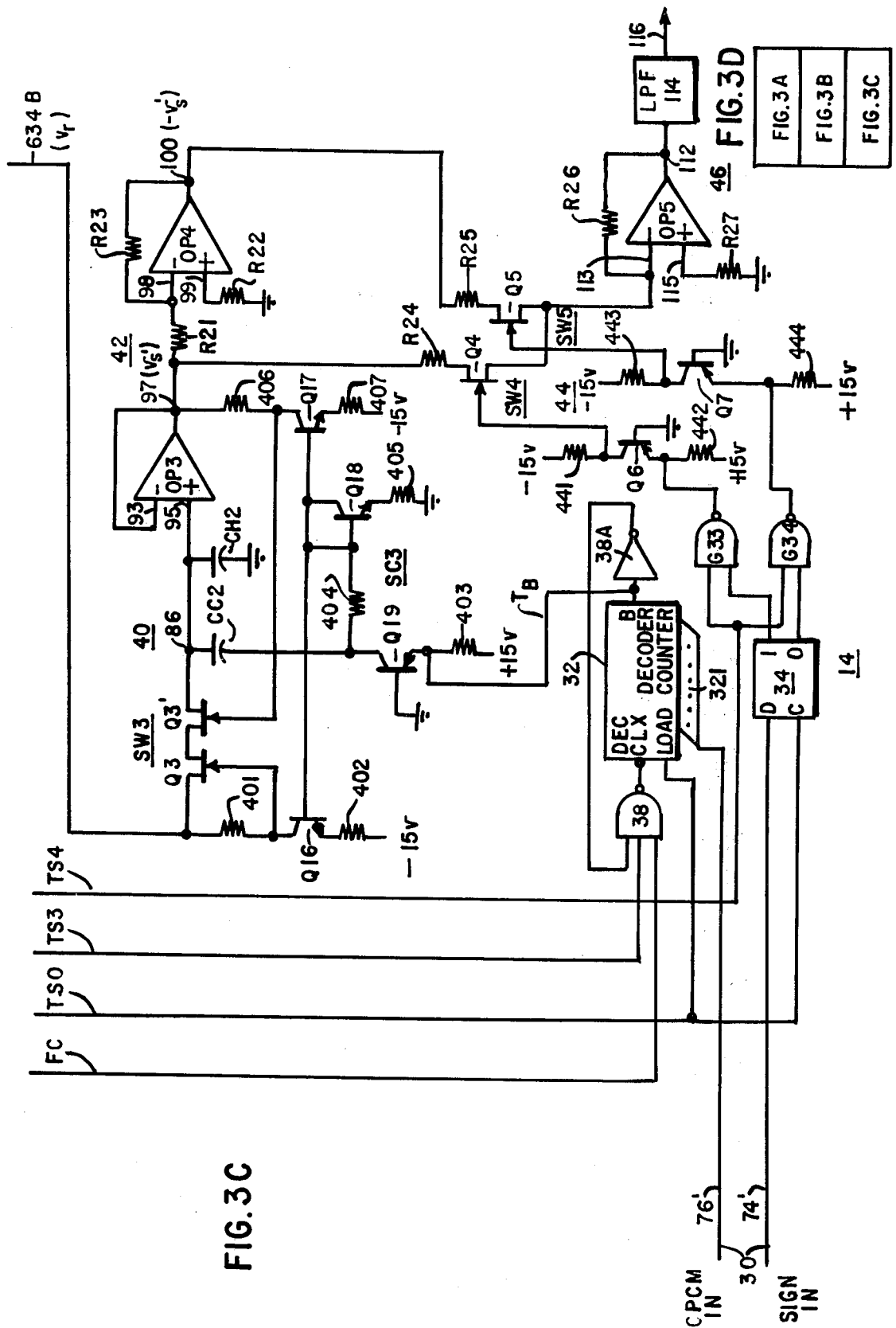

SIGNAL CODING FOR COMPRESSED PULSE CODE MODULATION SYSTEM

BACKGROUND OF THE INVENTION

1. Field of the Invention

This invention relates to signal coding for pulse code modulation systems, and more particularly, to encoders and decoders for telephone communication systems using compressed pulse code modulation with logarithmic companding.

2. Description of the Prior Art

The demand for communication services has been steadily increasing. In meeting this demand, it has proven effective in some communication systems to convert signals presented to the system into encoded digital signals and then reconvert the encoded digital signals into signals corresponding to those originally entered into the system. One example of a communication system in which such transmission of encoded digital signals has proven to have particular utility is a telephone communication system. Several schemes for digitally encoding signals in a telephone system are known. Although these encoding schemes are useful for both digital and analog signals entered into the telephone system, they have particular utility with continuous, time-varying analog signals such as voice signals.

In one encoding scheme, the amplitude of a voice analog signal is periodically sampled and each sample is converted into a digitally encoded pulse sequence, or word, representing the sampled analog signal. This operation is called sampling and quantizing of the analog signal. If the range of analog signal amplitudes represented by each quantum level or step of the quanitzing operation is uniform for all analog signal amplitudes, the encoded signal is said to be linear pulse code modulated (hereafter LPCM). Each LPCM signal word may then be decoded to form an analog signal of an amplitude substantially corresponding to the amplitude of the analog signal sample encoded into the LPCM signal word. Since the input analog signal was periodically sampled, the resulting periodic LPCM signal words may be formed into a continuous analog signal substantially corresponding to the continuous input analog signals.

In the quantizing process, the exact level of the entered analog signal at the sampling instant is, as described, approximated by one of a number of discrete values or quantum levels digitally encoded as the LPCM signal. The difference between the instantaneous amplitude of the input analog signal and the quantum level actually transmitted is called quantizing error and gives rise to what is variously known as quantizing noise or quantizing distortion.

Quantizing distortion is especially objectionable and very often intolerable when the instantaneous amplitude of the input analog signal is small, but is usually of little or no significance when the instantaneous amplitude of the input analog signal is high. This is because the low amplitude of the input signals permits a relatively low level of quantizing noise to significantly degrade the ratio of signal to noise, while a higher amplitude of the input signal can tolerate greater quantizing noise within an acceptable ratio of signal to noise. It is therefore desirable to have smaller quantum levels for lower amplitudes of the input signal to achive closer correspondence between the quantum level of the encoded signal and the actual amplitude of the input analog signal at the lower amplitudes, resulting in an acceptable ratio of signal to noise. Of course the size of the quantum levels for all input signal amplitudes could be decreased, but this produces an undesirable increase in the total number of quantum levels, requiring, for example, more bits to represent the signal as a digitally encoded word.

The suggested non-linear redistribution of the size of the quantizing levels is called companding, a verbal contraction of the terms compression and expanding. The purpose of companding is then to reduce the quantizing impairment of the original signal without unduly increasing the total number quantizing levels by quantizing on a non-linear rather than a linear basis.

It is current practice with telephone systems to compand encoded analog signals on either a $\mu$-law or an A-law companding scheme as described by H. Kaneko in an article entitled "A Unified Formulation of Segment Companding Laws and Synthesis of Codecs and Digital Companders", published in *The Bell System Technical Journal*, September, 1970. The resulting signals are then called compressed pulse code modulated signals (hereafter CPCM) or companded pulse code modulated signals. The $\mu$-law is being generally adopted in the United States. The "gross" continuous formulation for the $\mu$-law is:

$$|y| = \frac{\ln(1 + \mu|x|)}{\ln(1 + \mu)}$$

for $-1 \leq x \leq 1$. The variable x is the input amplitude normalized to the analog full scale and y the relative output amplitude, which in turn is encoded into a binary number expressing the magnitude of y on a linear basis. An additional bit, the sign bit, indicates the polarity of the signal sample x being encoded. Typically, the magnitude of y is expressed as a 6 or 7 digit binary number, corresponding to what is conventionally referred to 7 or 8 bit resolution (code). Accordingly, y is approximated to one out of 64 or 128 evenly distributed levels (disregarding the sign). Actually, in the "standard" version of CPCM adopted in the U.S., a continuous exponential (or logarithmic) companding law is not normally used. Instead the inverse function, $x = f(y)$, is approximated by 8 linear chords or segments, each sub-divided into 8 or 16 steps, depending upon the number of bits mentioned before (7 or 8). The segmented $\mu$-law is used to avoid implementation difficulties and to facilitate digital linearization features, but the resulting circuits are still somewhat complicated. It might be added that regardless of approach, a constant of $\mu = 255$ has been chosen. Separate studies show that the additional distortion caused by back-to-back operation of a "continuous encoder" and a "segmented decoder", or vice versa, is acceptable as such said added distortion being of the order of 3% or less.

SUMMARY OF THE INVENTION

An object of this invention is to provide for conversion between analog and digital signals with simplicity, enabling low cost implementation with standard components including integrated circuits.

Another object of the invention is to provide a codec having an encoder section and a decoder section, and a capacitor-resistor type companding generator common to both the encoder section and a decoder section.

The present invention has provided conversion apparatus and a method for relating a digital compressed pulse code modulation signal value to an analog signal value in accordance with a predetermined logarithmic companding law. The conversion apparatus includes an encoder portion having encoder counting means, a decoder portion including decoder counting means, and a companding generator common to the encoder portion and the decoder portion. The companding generator includes a capacitor and resistance means connected in series, means to charge the capacitor to a first potential and means effective starting at an initial time to discharge the capacitor through the resistance means toward a second potential. The apparatus further includes means effective starting at the initial time to advance the encoder counting means and to decrement the decoder counting means at a given frequency. The first and second potentials, the given frequency, and the RC time constant of the capacitor and the resistance means, are selected such that the number of steps counted by the encoder and decoder counting means is a simple function related to the ratio of the potential on the capacitor to a "full scale" value in accordance with a predetermined companding law.

In a disclosed embodiment, the predetermined logarithmic companding law is the µ-law:

$$|y| = \frac{\ln(1 + \mu|x|)}{\ln(1 + \mu)}.$$

The first potential is equal to the full scale potential of the analog signal value, the second potential is equal to the negative of the first potential divided by µ, and the given frequency is such that the time required to count a predetermined maximum number of steps is equal to RC $\ln(1+\mu)$ seconds, where RC is the time constant for the capacitor and the resistance means, and the binary representation of the number of steps advanced by the encoder counting means and by the decoder counting means is the corresponding compressed pulse code modulation signal value.

A method of relating a digital compressed pulse code modulation signal value to an analog signal value in accordance with a predetermined logarithmic companding law, comprises the steps of initially charging a capacitor through a resistance toward a second potential, measuring first and second intervals of time by stepping first and second counting means at a given frequency starting at the beginning of the discharge of the capacitor, using the potential on said capacitor to encode a sample of an analog signal value with a digital value by permitting said first counting means to increment until the absolute value of the potential on the discharging capacitor equals the absolute value of the potential of said analog signal sample, and using the potential on the discharging capacitor to simultaneously decode a digital value of an analog signal sample valve by sampling the potential on the capacitor as the capacitor discharges, and holding a decoded sample equal in magnitude to the capacitor potential when the decoder counter has decremented a number of steps determined by the input digital signal word.

Thus, in accordance with the present invention, the decaying voltage on a capacitor is used both in encoding an analog signal sample with a digital value, and in decoding a ditigal value to an analog signal value, the encoding and decoding operations being effected concurrently using a single companding generator.

DESCRIPTION OF THE DRAWINGS

These and other objects and features of the invention are best described by a description of an exemplary embodiment taken in conjunction with the drawing in which:

FIGS. 3A, 3B, and 3C, when arranged as shown in FIG. 3D, depict a detailed schematic of the encoder section, companding generator and timing circuitry, and the decoder section, respectively, of the codec of FIG. 1.

DESCRIPTION OF THE PREFERRED EMBODIMENT

Figure 1:
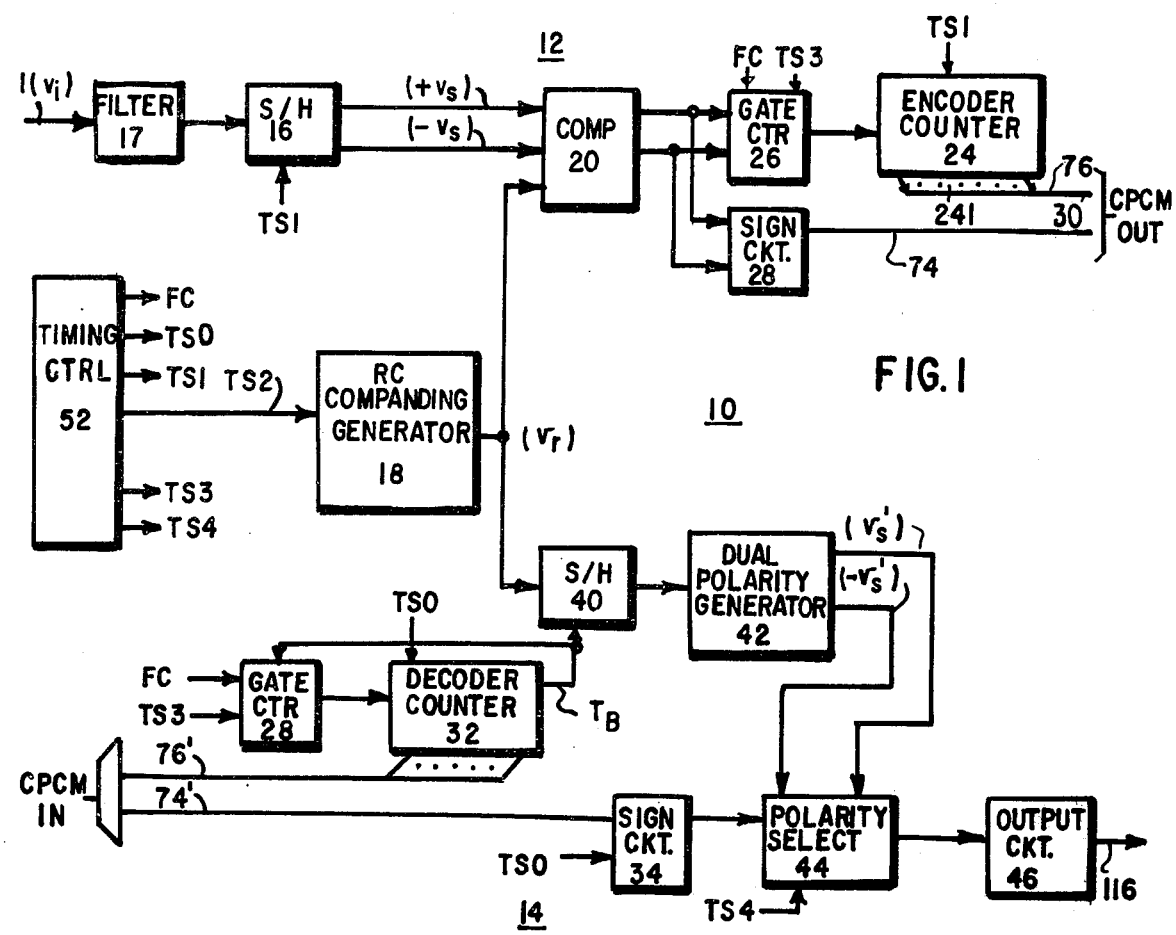
FIG. 1 is a simplified block diagram for a codec constructed in accordance with the principles of the invention.

Referring to FIG. 1 of the drawings, the codec 10 provided by the present invention has particular utility in communication systems employing pulse code modulation. The codec 10 includes an encoder section 12 for encoding time-varying analog signals, such as audito voice signals, in compressed PCM form, and a decoder section 14 for decoding compressed CPCM signals and providing analog signals representing the encoded information.

The analog signals $v_i$ presented to the codec on path 1 are encoded employing a µ-law companding scheme, such that the resulting encoded digital signals are compressed pulse code modulation signals, hereinafter referred to as CPCM signals. The continuous formulation for the µ-law is given by the following relationship:

$$y = \frac{\ln(1 + \mu|x|)}{\ln(1 + \mu)}$$

The variable x is the relative amplitude of the analog input signals, and y is the relative output amplitude, which in turn, is encoded into a multibit binary word representing the magnitude of y on a linear basis. An additional sign bit is provided to indicate the polarity of the signal sample being encoded.

Briefly, according to the invention, for analog-to-digital encoding, the continuous time-varying analog input signal $v_i$ is sampled and the analog sample $v_s$ is encoded to a corresponding multibit signal in accordance with the µ-law companding scheme. The analog signal $v_i$ is sampled by a sample and hold circuit 16 of the encoder 12, and a comparator circuit 20 compares the signal sample voltage $v_s$ and its inverted equivalent $-v_s$ with a time-varying reference voltage $v_r$ provided by a companding generator 18. The reference voltage $v_r$ decreases from a known amplitude at a known rate, and the time required for the reference signal $v_r$ to equal the magnitude of the signal sample voltage $v_s$ is measured by a binary digital encoder counter 24 of the encoder 12. The binary count at the time of coincidence, as detected by the comparator circuit 20, represents the CPCM code of the analog signal sample. This conversion gives the magnitude of the analog signal. The sign bit of the CPCM code, which indictaes the polarity of the analog signal being encoded, is obtained in a manner to be shown hereinafter.

For decoding a CPCM signal, the multibit binary words representing successive samplings of an audio voice signal, and each corresponding to the magnitude of an encoded analog signal sample, are individually loaded into a digital decoder counter embodied of the decoder 14, over path 76' and the counter 32 is then decremented from the starting count provided by the CPCM word to zero count. While the counter 32 is being decremented, the reference signal $v_r$ provided by the companding generator 18 is followed by a sample and hold circuit 40, operating in the track and hold mode, of the decoder 14. When the counter 32 reaches a zero count, the sample and hold circuit 40 enters the hold mode, and the amplitude of the reference signal $v_r$ corresponding to the amplitude of the encoded analog signal sample is held. A sign bit of the pulse code presented to the system at path 74' is used to assign the proper priority to the decoded signal sample in a manner to be shown hereinafter. The analog signals are supplied to an analog output filter which produces a smooth continuous analog signal at path 116 thereby re-constructing the audio voice signal originally encoded.

More specifically,, with reference to the encoder 12, a continuous time-varying analog signal $v_i$ supplied to the encoder is passed over a band-limited filter 17 to the sample and hold circuit 16 which is operable when enabled to sample the analog signal at a predetermined rate. By way of example, it is assumed that the code 10 employs an 8KHz sampling rate defining an operate cycle or frame of 125 microseconds. The analog signal is sampled once during each operate cycle, by the sample and hold circuit 16, which is enabled by the timing control signal TS1 to sample the time-varying analog signal $v_i$ for the sampling time interval. At the end of the sampling interval, the comparator circuit 20 is operable during the holding interval to compare the signal output $v_s$, representative of the charge on capacitor CH1 of the sample and hold circuit 16, and the complement $-v_s$ with the time varying signal $v_r$ which is provided by the companding generator.

The time varying signal $v_r$ provided by the companding generator 18, decreases from a predetermined amplitude E in a known interval of time established by the time constant of an RC network. When the amplitude of the reference signal $v_r$ has decreased to a value equal to the absolute value of the signal sample voltage $v_s$, the comparator circuit 20 provides a control output to stop the operation of the encoder counter 24. Thus, the content of the counter is the desired CPCM code.

During the holding interval, the encoder counter 24 is incremented by clock pulses at a rate FC provided by timing control 52 and extended to the binary counter 24 over a gate circuit 26 which is enabled by signal TS3 provided by the timing control 52. The gate circuit 26 is disabled when the control output is provided by the comparator circuit 20, inhibiting the passage of further clock pulses to the counter 24. At such time, the multibit output word of the counter 24 appearing at path 241, representing the state of the counter 24, indicates the time elapsed from the start of the holding interval, until coincidence of the signal sample voltage $v_s$ and the reference signal $v_r$, and thus, corresponds to the desired CPCM code representing the magnitude of the analog signal $v_i$ to which only a sign bit need to be added. The sign bit is obtained by a sign circuit 28 which is controlled by the comparator circuit 20 to provide an output indicating the polarity of the signal sample $v_s$.

The CPCM code, including the multibit word representing the state of the counter 24 on path 76, and the sign bit on path 74 are extended over a suitable communication line 30, to the decoder section of a similar codec at a receiving location.

The decoder section 14 basically operates in the inverse manner of the encoder 12 to convert the CPCM signals representing analog signal samples into a continuous analog signal which is a reconstruction of the encoded time varying analog signal from which the CPCM signals were derived. Each CPCM signal supplied to the decoder 14 is loaded into the counter 32 from path 76' during the sampling interval and before the start of the holding interval under the control timing signal TS0 provided by timing control 52, enabling a new word to be loaded into the counter 32 every 125 microseconds. TS0 is also used to load the sign bit from path 74' into a sign circuit 34 of the decoder.

At the start of the holding interval, a capacitor C of companding generator 18 discharges toward the reference potential $-dE$. In addition, signal TS3 provided by the timing control 52 enables gate control 28 to pass clock pulses at a rate FC to the counter 32 for decrementing the counter 32, concurrently with the incrementing of the encoder counter 24.

The decoder counter 32 is initially set to the digital value provided by the CPCM input signal and is decremented from such value to a zero count during the holding interval in response to the clock pulses supplied thereto over gate control 28.

When a zero count is reached by the decoder counter 32, the signal output $T_B$ of the counter 32 goes high providing a signal which changes the state of the sample and hold circuit 40 from track to hold, and the hold signal sample $v_s'$ corresponds to the magnitude of the analog signal represented by the CPCM signal being decoded.

The signal sample $v_s'$ and its complement, $-v_s'$, are extended to an output filter 46 via a polarity select network 44. The signal TS4 provided by timing control 52 enables the polarity select network 44 of the decoder 14 to respond to the sign circuit 34 to assign the proper polarity to the signal sample as extended to the output circuit 46.

The polarity select network 44 responds to a sign bit indicating positive polarity to permit the signal sample $v_s'$ to be extended directly to the output circuit 46 and to a sign bit indicating negative polarity to permit the signal sample $-v_s'$ to be extended to the output circuit 46. The output circuit 46 includes a low pass filter which produces a smooth continuous analog signal from the analog samples supplied thereto during successive codec operating cycles.

Figure 2:
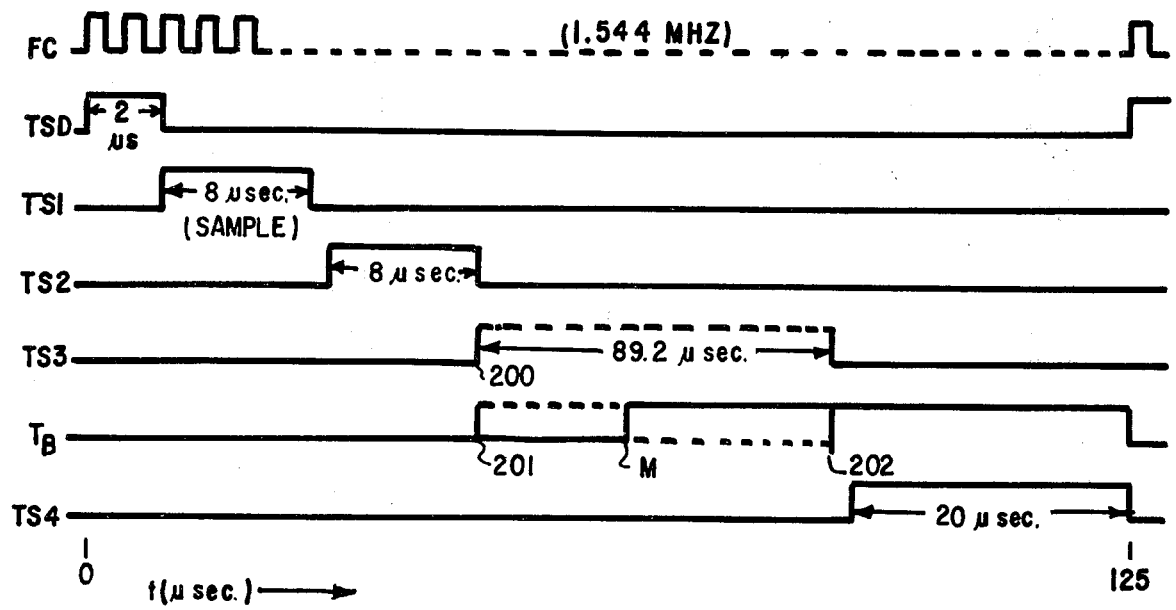
FIG. 2 is a timing diagram depicting the relevant logic states at various points throughout the system during a single codec operating cycle.

The timing logic signals generated by timing control 52 of FIG. 1 and their interrelationship are depicted in timing diagram of FIG. 2, wherein a full 125 microsecond cycle of operation of the illustrative codec is set out. It is to be noted with respect to FIG. 2, that the time periods shown are not drawn to scale, but are set out in a way to describe the successive timing steps utilized in the codec of the instant invention.

Referring to FIG. 1 and FIG. 2, the basic clock for stepping encoder counter 24 and decoder counter 32 delivers a 1.544 MHz pulse train, or 193 pulses per 125 microseconds cycle of codec operation, at path FC.

At the initiation of the 125 microsecond cycle, a logic ONE signal of 2 microsecond width is presented at path TS0 by timing control 52. This TS0 pulse is used to preload the decoder counter 32 with the input CPCM data word appearing at path 76' and to register the sign bit presented at path 74' into sign circuit 34.

At the end of the two microsecond TS0 pulse, an 8 microsecond logic ONE pulse is presented at path TS1 by logic control 52. During this interval, TS1 at logic ONE functions to place sample and hold circuit in the sampling mode to track the system analog inputs $v_i$ to obtain the next potential level for encoding into CPCM format. Additionally, TS1 is utilized to clear the contents of encoder counter 24 in preparation for a new encoding operation.

Approximately 2 microseconds after the conclusion of the system input sampling interval defined by TS1, timing control 52 generates a new CPCM 8 microsecond logic ONE pulse at path TS2. The TS2 8 microsecond pulse is used to initialize the reference voltage $v_r$ of companding generator 18 to the maximum value in preparation for capacitive discharge during the encoding and decoding operations. At the conclusion of the TS2 pulse, TS3 goes to logic ONE (point 200 of FIG. 2) for an interval of 89.2 microseconds. At this time, the actual encoding and decoding processes commence at counters 24 and 32, respectively. For the illustrative embodiment, a 7-bit code is utilized for the CPCm code magnitude, corresponding to a maximum count during TS3 of 128 FC pulses at 1.544 MHz, hence the TS3 interval of 89.2 microseconds. During the TS3 pulse, encoder counter 24 increments until the reference voltage $v_r$ from companding generator 18 decays to a value equal to the magnitude of the sampled analog input $v_s$. Simultaneously, during the TS3 pulse, decoder counter 32 decrements from its present value down to zero, at which time a logic ONE state is placed on path TB by counter 32 at a point such as M of FIG. 2. Depending on the initial CPCM word loaded into counter 32, point M may occur as early as point 201 (all zero code word) or as late as point 202 (all 1's code word). When TB goes to logic ONE, sample and hold circuit 40 is switched from track to hold, dual polarity generator 42 delivers $+v_s$, and $-v_s'$ at its output — where $v_s'$ is the magnitude of the decoded signal level.

Approximately 2 microseconds after the conclusion of the TS3 pulse, timing control 52 generates a 20 microsecond logic ONE pulse at its path TS4. The TS4 pulse is utilized to enable polarity select circuit 44 gate the properly signed analog voltage level $v_s'$ to the output circuit 46 and thence to the system's analog output at path 116. At the conclusion of the TS4 pulse, the 125 microsecond cycle of codec operation is complete, and the sequence beginning with the TS0 pulse, is restarted for the next operating cycle.

DETAILED DESCRIPTION

Figure 3A:
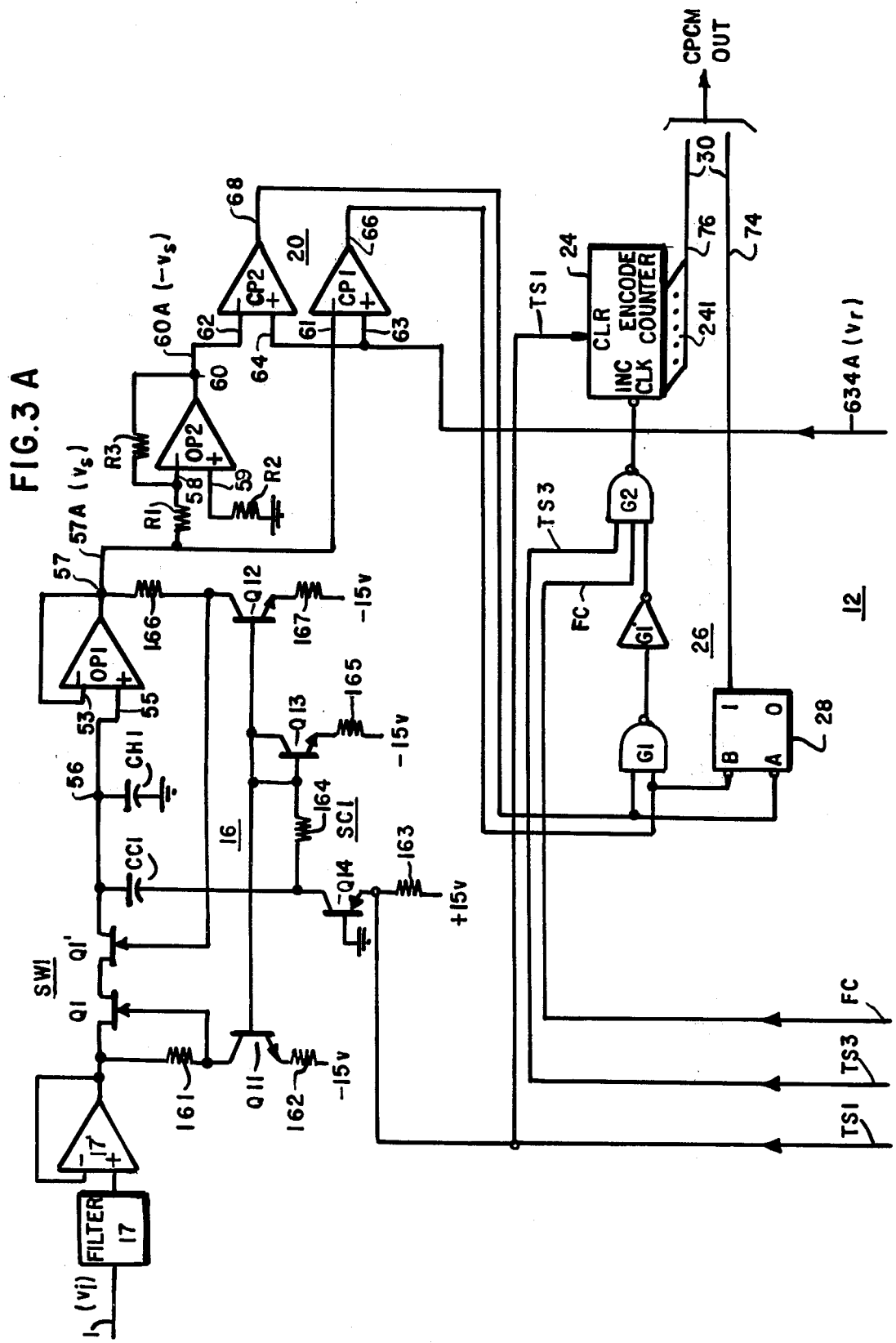
Figure 3B:
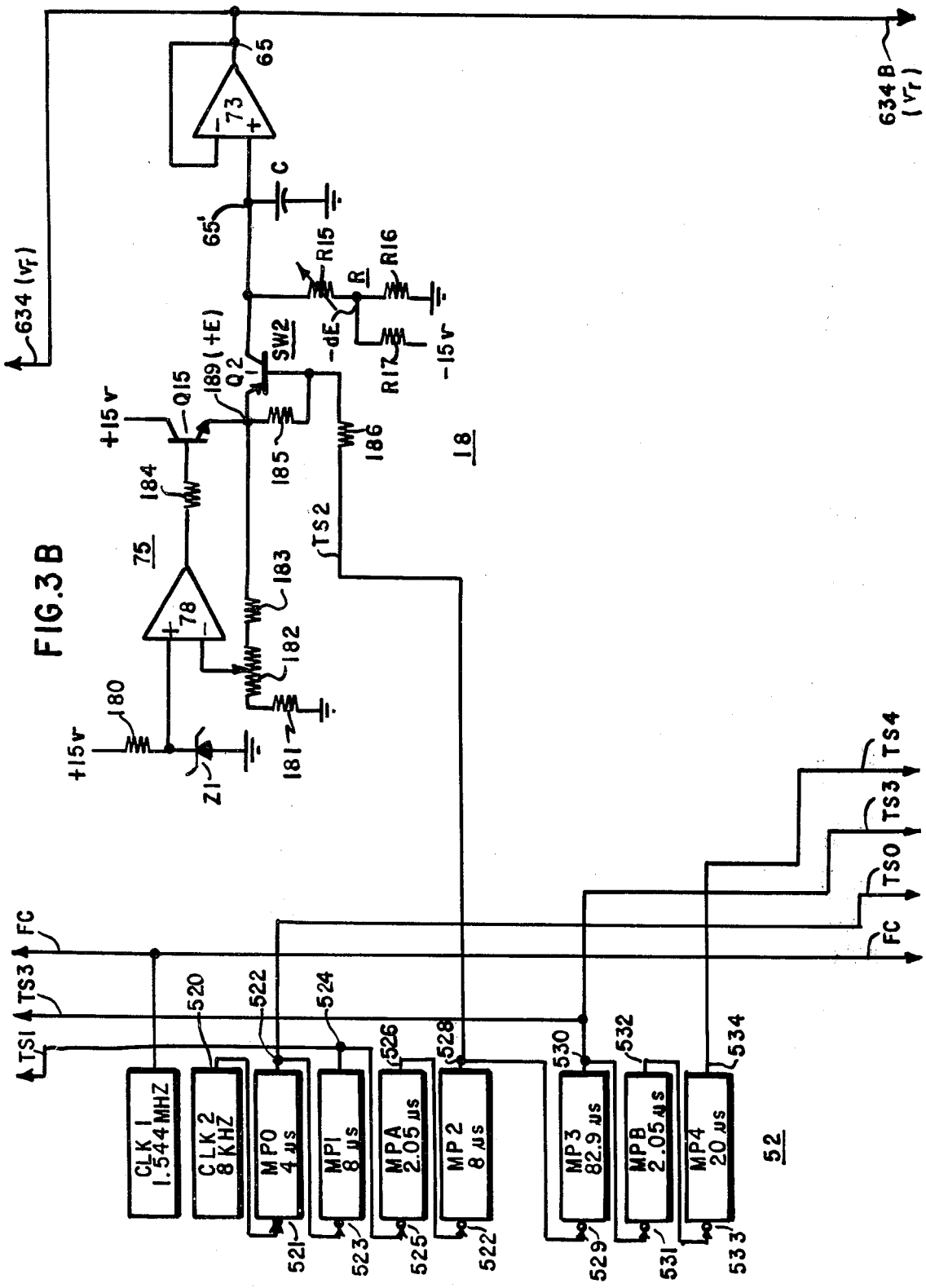

The detailed description of the codec of the illustrative embodiment is best undertaken in conjunction with the logic level timing diagram of FIG. 2 and the schematics of FIGS. 3A, 3B, and 3C, arranged as shown in FIG. 3D.

Encoder Section Structure — FIG. 3A

Referring to FIG. 3A, which includes a schematic representation of the encoder 12, the analog input signal $v_i$ is extended to the sample and hold circuit 16 over low pass filter 17 and its output stage 17'. The filter 17 may be an active filter having a bandwidth corresponding to the limit frequency of the time-varying analog signal $v_i$ to be encoded. In the present example, where it is assumed that the analog signals are voice-frequency signals, the bandwidth of the filter 17 may correspond to the frequency limit of the voice band.

The illustrative sample and hold circuit 16 shown in FIG. 3A includes holding capacitor CH1 and sampling switch SW1, which is embodied as a pair of FET transistors Q1, and Q1', which when enabled, connect one side of the capacitor CH1 to the output of the output stage 17' of filter 17 to receive the voice-frequency signals $v_i$ input to the encoder at path 1. The enabling of the FET devices Q1 and Q1' is controlled by a switch control circuit SC1, including transistors Q11 through Q14 and associated bias resistors 161 through 167. Signal path TS1 from timing control 52 of FIG. 3B is coupled to the emitter of Q14. During the sampling interval, a logic ONE comprising a ground potential low impedance signal on path TS1 causes transistors Q11 through Q14 to be cut off, which biases the FET devices Q1 and Q1' to the low impedance "on" condition permitting sampling of the analog input signal $v_i$ by capacitor CH1. During the holding interval, a logic ZERO comprising an open high impedance signal on path TS1, causes transistors Q11 - Q14 to conduct, thereby biasing the FET devices Q1 and Q1' to a high impedance "off" condition. A compensation capacitor CC1 compensates for charge current via the parasitic capacitance of FET device Q1'.

The sampling circuit 16 further includes a pair of operational amplifiers OP1 and OP2, such as the National Semiconductor Types 310 and 318, respectively, which respectively provide complementary output signals $v_s$ and $-v_s$, where $v_s$ corresponds to the magnitude of the signal voltage across the holding capacitor CH1.

Amplifier OP1, which is connected for operation as a voltage follower, has a non-inverting input 55 connected at point 56 to one side of capacitor CH1, the other side of which is connected to ground. The output 56 of the amplifier OP1 is connected directly to the inverting input 53 of amplifier OP1 and to biasing resistor 166 of switch control SC1.

The output 57 of amplifier OP1 is also connected via path 57A and resistor R1 to the inverting input 58 of amplifier OP2, which has its non-inverting input 59 connected over a resistor R2 to ground, and its output 60 connected over a resistor R3 to the inverting input 58. Resistors R1 and R3 are of equal resistance, providing unity gain for the amplifier OP2 which operates in the inverting mode.

The outputs 57 and 60 of respective amplifiers OP1 and OP2 are further respectively connected to inverting inputs 61 and 62 of a pair of operational amplifiers CP1 and CP2, which comprise the comparator circuit 20. The noninverting inputs 63 and 64 of the amplifiers CP1 and CP2 are commonly connected via path 634a to the output of the companding generator 18 of FIG. 3B. The amplifiers CP1 and CP2 may, for the sake of example, be the National Semiconductor Type 311, which are chosen for high speed and small offset voltage.

The gate control 26 of FIG. 1 is comprised of NAND gates G1 and G2 and inverter G1' shown in FIG. 3A. The sign circuit 28 of FIG. 1 is comprised of a set-reset flip-flop also designated 28 in FIG. 3A. The output of comparator amplifier CP1 is extended via path 66 to a first input gate G1 and to the S, or SET, input of sign flip-flop 28. The output of comparator amplifier CP2 is extended via path 68 to a second input of gate G1 and to the R, or reset, input of sign flip-flop 28.

The output of gate G1 is coupled, by inverter G1', to a first input on NAND gate G2. The second and third inputs of G2 are respectively coupled to control signal paths FC and TS3 of timing control 52 of FIG. 3B. The output of gate G2 is coupled to the incrementing, or up-count, input (INC CLK) of encoder counter 24. The clear (CLR) input of counter 24 is coupled to control signal path TS1.

The encoder's CPCM output is furnished at system output 30 which comprises the outputs 241 of encoder counter 24, shown collectively at path 76, and a sign bit on path 74 coupled from the true, or "1", output of sign flip-flop 28.

Decoder Section Structure — FIG. 3C

A schematic representation of the decoder section 14 is shown in FIG. 3C. The magnitude bits of the CPCM code word to be decoded are presented via path 76' to the data inputs 321 of decode counter 32, while the sign bit of the word to be decoded is coupled to decoder sign D-type clocked flip-flop 34 at its D input via path 74'. The data at counter inputs 321 of counter 32 is effectively registered at the counter whenever a logic ONE is present on control signal path TS0 from timing control 52 of FIG. 3B. Additionally, TS0 is coupled to the clock, or C, input to gated D-flip-flop 34 to simultaneously register the sign bit appearing on path 74'.

Decoder counter 32 is selected such that a negative going pulse at its DEC-CLK input will decrement the preloaded contents by one count. The borrow, or B, output of counter 32 presents a logic ZERO to logic ONE transition when the counter 32 has decremented through an all-zero state. Decrementing pulses are coupled to the DEC-CLK input of counter 32 from the output of NAND gate 38 whose three inputs are respectively couple to signal path FC from timing control 52 of FIG. 3B, signal path TS3 from timing control 52 of FIG. 3B, and the B output of counter 32, inverted by inverter 38A. Gates 38 and 38A OF FIG. 3C are seen to correspond to the gate control circuit 28 of the block diagram of FIG. 1.

Decoder section 14 of FIG. 3C further includes a sample and hold circuit 40 which includes a holding capacitor CH2, compensating capacitor CC2, and a sampling switch SW3 and associated switch control SC3. SW3, in turn, is embodied as a pair of field effect transistors Q3 and Q3' and SC3 includes transistors Q16 through Q19 and their associated biasing resistors 401 through 407. A logic level ZERO (comprised of low impedance ground) at the B output of counter 32 is coupled via signal path TB to the emitter of Q19 of SC3, thereby rendering Q16 through Q19 non-conductive which, in turn, biases the FET devices Q3 and Q3' to the low impedance "on" state, thus permitting tracking of the reference voltage $v_r$ appearing on path 624B for the output of companding generator 18 of FIG. 3B. When decoder counter 32 has decremented to the all zero state, the logic ONE is presented via path TB to render Q16 through Q19 conductive, thereby forcing SW3 to the high impedance state to hold the voltage at a level $v_s'$ — that potential to which $v_r$ from the companding generator 18 of FIG. 3B has decayed during the decrementation of decoder counter 32.

The tracked and held potential $v_s'$ across capacitor CH2 is coupled to dual polarity generator 42 which includes a pair of operational amplifiers OP3 and OP4. OP3 and OP4 may, for example, be respectively chosen as National Semiconductor Types 310 and 318. Amplifier Op3, which is arranged for operation as a voltage follower, has a non-inverting input 95 coupled to one side of hold capacitor CH2. The output 97 of OP3 is coupled directly to the inverting input 93 of OP3.

The output 97 of OP3 is also coupled via resistor R21 to the inverting input 98 of amplifier OP4, which has its non-inverting input 99 coupled to ground via resistor R22 and its output 100 coupled via resistor R23 to its inverting input 98. R21 and R23 are selected to be of equal resistance, thereby providing OP3 with a gain of $-1$. Hence, OP3 and OP4 respectively provide the required dual outputs of polarity generator 42 of $+v_s'$ and $-v_s'$.

The polarity select network 44, under the control of sign flip-flop 34, enables the selection of one of the output signals provided by the amplifiers OP3 and OP4 to provide a signal of a desired polarity to the ouput circuit 46. The output select network 44 includes a pair of switches SW4, and sW5, embodied as field effect transistors Q4 and Q5, respectively, which are normally maintained in a high impedance or "off" condition. The FET devices have associated switch control circuits including biasing resistors 441 through 444 and transistors Q6 and Q7, enabling of which is respectively controlled by AND gates G33, G34, and the logic state appearing on control signal lead TS4 from timing control 52 of FIG. 3B. Gate 33 has a first input connected to the true output of the sign flip-flop 34, and a second input connected to control signal path TS4. Gate 33 is enabled by the signal on TS4 whenever the sign flip-flop 34 is set, thereby enabling transistors Q6 to switch FET device Q4 to an "on" or low impedance state to connect the output of amplifier OP3 over resistor R24 to an input 106 of the output circuit 46, extending the positive polarity sample signal $v_s'$ to the output circuit.

Similarly, gate G34 has a first input connected to the false output of the sign flip-flop 34 and a second input connected to TS4, to be enabled by TS4 whenever the sign flip-flop 34 is reset. Gate G34, in turn, enables transistor Q7 to switch transistor Q5 to a low impedance state to connect the output of amplifier OP4 over a resistor R25 to the input 106 of the output circuit 46, thereby extending the negative polarity sample signal $-v_s'$ to the output circuit 46.

The output circuit 46 comprises an active filter 114 of proper input impedance and operational amplifier OP5. A resistor R26 is connected between the output 112 of the amplifier OP5 and the input 113, and a resistor R27 is connected between input 115 of amplifier OP5 and ground.

Resistors R24, R25, R26, and R27 are selected to provide output amplifier OP5 with a gain sufficient to compensate for the fact that the output signal is presented to the filter 114 for only a fraction of the codec's operating cycle (e.g. 20/125 in the illustrative embodiment). The output 112 of OP5 is coupled to low path filter 114 whose output at path 116 comprises the desired decoded analog signal.

Timing Control and Companding Generator — FIG. 3B

Timing control 52 of FIG. 1 is depicted in more illustrative detail in FIG. 3B. There are numerous alternatives available, well known in the art, that may be used to generate the basic logic timing pattern depicted in FIG. 2. For the illustrative embodiment as partially set out in FIG. 3B, it is seen that timing control 52 is, for this example, comprised of a chained set of monopulsers and two basic clock circuits operating at b 1.544 MHz and 8 KHz, respectively.

Referring to FIG. 3B, clock circuit CLK1 has its output coupled to control signal path FC for distribution of clock pulses at a 1.544 MHz rate, said pulses used for the bsic counting rates in the encoding and decoding process of the illustrative codec.

Clock circuit CLK2 produces a positive-going transition, at a rate of 8 KHz at its output 520 to thereby trigger the input 521 of monopulser MP0, resulting in a 2 microsecond logic ONE pulse at the output 522 of MP0 every 125 microseconds— the basic cycle time of the codec. MP0 output 522 is coupled to control signal path TS0 and to input 523 of monopulser MP1.

Monopulser MP1, in response to the negative-going termination of the MP0 pulse at input 523, delivers an 8 microsecond logic ONE pulse at its output 524, which is coupled to control signal path TS1 and to input 525 of monopulser MPA.

Monopulser MPA delivers a 2.05 microsecond logic ONE pulse at its output 526 in response to the negative-going termination of the MP1 8 microsecond pulse. Output 526 of MPA is coupled to the input of 527 of monopulser MP2 which produces an 8 microsecond logic ONE pulse at its output 528, in response to the negative-going termination of the MPS pulse coupled to input 527 of MP2. Output 528 of MP2 is coupled to control signal path TS2 and to input 529 of monopulser MP3.

Monopulser MP3 delivers an 82.9 microsecond logic ONE pulse at its output 530 in response to the negative-going termination of the MP2 pulse coupled to input 529 of MP3. Output 530 of MP3 is coupled to control signal path TS3 and to input 531 of monopulser MPB. MPB delivers a 2.05 microsecond logic ONE pulse at its output 532 in response to the negative-going termination of the MP3 pulse coupled to input 531 of MPB. Output 532 of MPB is coupled to input 533 of monopulser MP4.

Monopulser MP4 delivers a 20 microsecond logic ONE pulse at its output 534 in response to the negative-going termination of the MPB pulse coupled to iput 533 of MP4. Output 534 of MP4 is coupled to control signal path TS4. Thus, it is seen from the above structure that the 125 microsecond operating cycle timing waveforms of FIG. 2 may be repetitively generated by the monopulser logic and clock circuits comprising the timing control 52 of FIG. 3B.

The companding generator 18 includes a reference source 75, control switch SW2, resistor network R, capacitor C, and a buffer amplifier 73. The control switch SW2, which may, for example, be embodied as a Type 2N2904 transistor Q2 operating in the switching mode, is operable and enabled to connect one side of capacitor C at point 65' to a fixed reference potential +E provided by the reference source 75 at node 189. The other side of capacitor C is connected to ground. The reference source 75 comprises an operational amplifier 78, a 9 volt zener diode Z1, and emitter follower utilizing transistor Q15, and associated bias resistors 180 through 185, which derive a constant voltage E of 10 volts from a 15 volt supply.

Resistor network R is connected between point 65' and the −dE. potential -dE. Resistor R comprises a voltage divider formed by resistors R15 - R17, resistors R15 - R16 being connected in series between point 65' and ground, and resistor R17 being connected between the junction of resistors R15 and R16, indicated at −dE and a source of −15 vdc. The value of R is equal to:

$$R17 + \frac{(R15)(R16)}{R15 + R16}.$$

By making resistor R16 very small compared to resistor R15, and resistor R17, the voltage −DE is approximately equal to:

$$\frac{(-15)(R16)}{R16 + R17} v.$$

The enabling of transistor Q2 is controlled by the logic level appearing on control signal path TS2 from the timing control circuit 52 which causes transistor Q2 to conduct for the charging of capacitor C for a predetermined duration.

When the switch SW2 is closed, capacitor C charges to the potential +E. When the switch SW2 is opened at the end of the sampling interval, capacitor C discharges over resistance R towards the potential −dE, with a time constant determined by the capacitor C and resistance R.

The voltge $v_r$ across the capacitor C may be expressed by:

$$v_r = -dE + (1+d)E \cdot e^{-t/T}.$$

Where T is the time constant for capacitor C and the resistance R. Rearranging terms, and dividing by dE gives:

$$1 + \frac{v_r}{dE} = (1 + d)e^{-t/T}. \quad (3)$$

The signal sample voltage $v_s$ can be expressed as a relative amplitude "x" out of a full scale voltage $v_0$, that is $v_s = xv_0$. In accordance with the present invention, the voltage $v_r$ is compared with the signal sample voltage $v_s$, and the time t, as a function of x is determined by the time at which the capacitor voltage $v_r$ has decreased to the value of $v_s$, that is when $v_r = xv_0$. Substituting this valve for $v_r$ into equation (3), in taking the natural logarithms that both sides of the equation results in:

$$\ln(1 + \frac{xv_0}{dE}) = \ln(1 + \frac{1}{d}) - \frac{t}{T}. \quad (4)$$

The terms $v_0$, d, and e are constants, and accordingly, can be chosen such that $v_0/dE = \mu$. Substituting this value into equation (4) yields:

$$\ln(1 + \mu x) = \ln(1 + \frac{1}{d}) - \frac{t}{T}. \quad (5)$$

Transposing terms and substituting $d = v_0/\mu E$ into equation (5) yields:

$$\ln(1 + \frac{E}{\mu v_0}) - \frac{t}{T} = \ln(1 + \mu x). \quad (6)$$

Then, choosing $E = v_0$, and dividing both sides of the equation (6) by $\ln(1+\mu)$ yields:

$$1 - \frac{t}{T\ln(1 + \mu)} = \frac{\ln(1 + \mu x)}{\ln(1 + \mu)}. \quad (7)$$

Introducing the time $T' = T \cdot \ln(1+\mu)$ gives:

$$1 - \frac{t}{T'} = \frac{\ln(1 + \mu x)}{\ln(1 + \mu)}. \quad (8)$$

Now, note the previously discussed formula for the μ-Law:

$$|y| = \frac{\ln(1 + \mu|x|)}{\ln(1 + \mu)}. \quad (1)$$

Comparing equations (8) and (1), it is evident that y in the continuous companding law, equation (1), equals complement of the relative time t/T'. In other words, by choosing E equal to the full scale voltage $v_0$ of the signal to be encoded, setting $d = 1/255$, and choosing the clock frequency for the digital counters such that the maximum count of the counter, that is 64, 128, etc., is obtained during a time $T\ln(1+\mu)$, then the contents of the counter at coincidence between $v_r$ and the absolute value of signal sample $v_s$ directly represents the 6 or 7 bits of the desired CPCM code to which only a sign bit need be added. The codec of the illustrative embodiment uses a 1.544 MHz clock rate and a 7-bit magnitude portion for the CPCM code. Hence the maximum count allowable is $2^7=128$, corresponding to a maximum counting interval of 89.2 microseconds, a value which must be equated to $RC\ln(1+\mu)$ in selecting the various parameters for companding generator 18.

Encoder Operation — FIGS. 2, 3A, 3B

A step-by-step description of the encoding procedure for the codec of the illustrative embodiment is best set out with reference to the timing diagram of FIG. 2 and the schematic diagrams of the encoder section 12 and companding generator 18 of FIGS. 3A and 3B, respectively.

As seen from FIG. 2, the 125 microsecond codec operating cycle is initiated by the 2 microsecond TSO pulse. During TS0 time, the contents of encoder counter 24 (FIG. 3A) and the value of the sign bit, as determined by the previous operation cycle, may be sent to a distant decoding entity via paths 76 and 74, respectively.

At the conclusion of the TS0 pulse, the encoder sampling function is initiated by the logic ONE pulse at path TS1. Logic ONE at TS1 is coupled to the emitter of Q14 (FIG. 3A) to render transistors Q11 through Q15 nonconductive, thereby placing the source to drain states of Q1 and Q1' in the low impedance sampling state, wherein the analog input potential at the output of amplifier 17' is followed by sampling capacitor CH1. Additionally, during the TS1 pulse, encoder counter 24 is reset to the all ZERO condition by coupling TS1 to the CLR input of counter 24 in preparation for encoding of the analog signal presently being sampled.

At the termination of the TS1 8 microsecond sampling interval, transistors Q1 and Q1' assume the high impedance state to effectively hold the sample analog input at capacitor CH1. The sampled analog input $v_s$ is presented to the inverting input 61 of comparator amplifier CP1 via operational amplifier OP1, while the complement of the voltage sample $-v_s$ produced at the output of operational amplifier OP2, is presented to the inverting input 62 of comparator amplifier CP2.

After a settling time of approximately 2.05 microseconds (provided by monopulser MPA of FIG. 3B), an 8 microsecond logic ONE pulse is coupled via TS2 to initialize companding generator 18 of FIG. 3B. Logic level ONE at TS2 is coupled via resistor 186 to the base of transistor Q2 rendering it conductive. Reference voltage +E at node 189 is developed by reference source 75. Hence, when Q2 is rendered conductive during the TS2 pulse, capacitor C is charged to a initial level of +E volts.

At the conclusion of the TS2 pulse, an 89.2 microsecond logic ONE pulse is generated at TS3. At this time, Q2 of companding generator 18 is switched "off" thereby initiating a discharge of capacitor C toward a potential $-dE$ developed by resistor network R at a discharge time constant $T=RC$. Simultaneously, at the initiation of the TS3 pulse, gate G2 (FIG. 3A) is enabled via path TS3 to pass pulses from FC to begin incrementing encoder counter 24.

Durng the encoder counting interval, comparator amplifiers CP1 and CP2 continuously compare the capacitively discharging reference voltage $v_r$, provided by companding generator 18 via path 634A, with $+v_s$ and $-v_s$, respectively. First assume the sample $v_s$ was of positive polarity. Then when $v_r$ discharges to a level substantially equal to $v_s$, the output 66 of CP1 goes low to (1) force the output of NAND gate G1 high which, in turn, via inverter G1', locks the output of G2 high to inhibit further incrementation of encoder counter 24, and (2) set the sign flip-flop 28 to indicate positive polarity of the analog input sample. Alternatively, if the sample $v_s$ was of negative polarity, then when $v_r$ discharges to a level substantially equal to $-v_s$, the output 68 of CP2 goes low to inhibit further incrementation of encoder counter 24 via G1 and G1' and to reset the sign flip-flop 28 to indicate negative polarity of the analog input sample.

Hence, at coincidence of $v_r$ with the magnitude of $v_s$, the contents of encoder counter 24 presented at counter outputs 241, along with the sign indicator bit taken at path 74 from the true output of flip-flop 28 comprise the desired CPCM encoding result which is available at data link 30 until the recurrence of timing control pulse TS1 in the next cycle of codec operation.

Decoder Operation — FIGs. 2, 3B, 3C

In accordance with the instant invention, the decoder section 14 (FIG. 3C) operates contemporaneously with the encoder section 12 (FIG. 3A) in conjunction with the shared companding generator 18 (FIG. 3B) and a timing control circuitry 52 (FIG. 3B) which generates the basic logic timing waveforms depicted in FIG. 2.

As mentioned in conjunction with the encoder section, at the initiation of the 125 microsecond operation cycle, a 2 microsecond logic ONE pulse is provided by timing control 52 at path TS0. The decoder section 14 of FIG. 3C utilizes logic ONE at TS0 to transfer the magnitude portion of the CPCM code word to be decoded into decoder counter 32 at data inputs 321 and to register the sign bit of the input code word at D flip-flop 34. With the newly-loaded inputs to counter 32 being registered therein, the B output is logic ZERO (low impedance ground) which, via path TB to the emitter of Q19, renders Q16 through Q19 non-conductive, thereby placing the switch SW3 (comprising transistors Q3 and Q3') in the low impedance tracking state. While in the track state, capacitor CH2 will assume a potential substantially equal to the companding generator reference voltage $v_r$ supplied over path 634B.

While the encoder 12 is performing the sampling function during the TS1 pulse, and while the companding generator 18 is being initialized during the TS2 pulse, as described hereinabove, the decoder 14 maintains the state assumed during the TS0 pulse.

With the initiation of a logic ONE signal at path TS3, NAND gate 38 is enabled to pass clock pulses at a rate set by signal path FC to the DEC-CLK input of decoder counter 32. Negative-going pulses at DEC-CLK decrement counter 32 from its preset value determined according to the input CPCM code word to be decoded. Hence, it is seen from FIGS. 3A, 3B, and 3C that decoder counter 24 begins incrementation at the same time that decoder counter 32 begins the complementary function of decrementation, while a single reference voltage $v_r$ is monitored by both the decoder and the encoder.

When decoder counter 32 has decremented from its originally loaded state to the all-ZERO state, counter output B provides a high-impedance logic ONE signal to path TB which places SW3 in the high impedance hold state by turning on transistors Q16 through Q19, and inhibits further counter decrementation by providing a logic ZERO input to NAND gate 38 via inverter 38A. This time point is shown, by example, to be point M of the TB waveform of FIG. 2. At time M, the voltage across hold capacitor CH2 represents the potential magnitude, $v_s'$, of the decoded signal.

Dual polarity generator 42 of the decoder is comprised of operational amplifiers OP3 and OP4. Positive $v_s'$ is developed at output 97 of OP3, while $-v_s'$ is developed at output 100 and OP4. Signals $v_s'$ and $-v_s'$ are respectively coupled to resistors R24 and R25 of polarity select circuit 44.

During the final 20 microseconds of the codec operation cycle, appropriately-signed $v_s$ is gated to output circuit 46 by switch SW4 (transistor Q4) or switch SW5 (transistor Q5). During the said 20 microseconds, logic ONE at TS4 primes AND gates G33 and G34 for operation dependent upon the value of the received CPCM signed bit at flip-flop 34. If the sign bit is ONE, gate G33 is enabled during the TS4 pulse to close SW4 via transistor Q6, thereby passing $+v_s'$ from OP3 to input 113 of output circuit operational amplifier OP5. Alternatively, if the sign bit is ZERO, gate 34 will be enabled during the TS4 pulse to close SW5 via transistor Q7, thereby passing $-v_s'$ from OP4 to input 113 of OP5. OP5 and low pass filter 114 provide appropriate amplification and smoothing for presenting a suitable decoded continuous analog signal to system output 116 over successive 125 microsecond decoding periods.

It should be noted that the invention described herein has been illustrated with reference to a particular embodiment. It is to be understood that many details used to facilitate the description of such a particular embodiment are chosen for convenience only and without limitation on the scope of the invention. Other embodiments may be devised by those skilled in the art without departing from the scope and spirit of the invention. For example, the desired timing waveforms of FIG. 2 may be generated by numerous techniques in addition to the specific chained-monopulser approach described. Furthermore, the illustrative embodiment is arranged to generate a so-called "complementary" CPCM code, wherein maximum analog signal magnitude is represented by the all-ZERO code word, while minimum analog signal magnitude is represented by all-ONE's. It would be relatively simple to achieve an alternative arrangement wherein a straight binary CPCM representation is encoded — i.e. where a minimum magnitude would correspond to the all-ZERO code word and the maximum magnitude would correspond to all ONE's code. This would be accomplished by proper manipulation of the counter outputs (e.g. logical inversion or alternatively, by counting down from a preset maximum rather than counting up from ZERO during the encoding state).

Accordingly, the instant invention is intended to be limited only by the scope and spirit of the appended claims.

What is claimed is:

1. In a conversion apparatus for relating a digital compressed pulse code modulation signal value to an analog signal value in accordance with a predetermined logarithmic companding law, an encoder means including encoder counting means, a decoder means including decoder counting means, and a companding generator common to said encoder means and said decoder means;
said copanding generator including a capacitor and resistance means connected in series, means to charge said capacitor to a first potential of a first polarity and effective starting at an initial time to discharge said capacitor through said resistance means toward a second potential of the opposite polarity;
means effective starting at said initial time to step both said encoder counting means and said decoder counting means at a given frequency; said first and second potentials, said given frequency, and the RC time constant of said capacitor and said resistance means being so related to one another that the number of steps counted by said encoder and decoder counting means is a simple function related to the ratio of the potential on said capacitor to a "full scale" value for said analog signal in accordance with said predetermined companding law, and wherein said predetermined logarithmic companding law is the $\mu$-law, said first potential is equal to the full-scale potential of said analog signal value, and said second potential is equal to the negative of said first potential divided by the value of $\mu$ for said $\mu$-law.

2. Conversion apparatus as set forth in claim 1, wherein said encoder means includes comparison means coupled to an output of said companding generator for comparing the potential on said capacitor with the potential of an encoder sample of an analog input signal and providing a comparison output signal for inhibiting said encoder counting means upon detecting equality of the magnitudes of said potentials of said encoder sample and said capacitor; and wherein said decoder means includes decoder sample and hold means coupled to said output of said companding generator for sampling the potential on said capacitor; said decoder sample and hold means including switch means coupled to said decoder counting means, decoder control means to change said switch means from an ON state to an OFF state in response to said decoder counting means having counted a number of steps determined by an input digital signal word; whereby said decoder sample and hold means holds a resultant decoder sample having a potential from said capacitor representing the analog signal magnitude corresponding to said input digital signal word.

3. Conversion apparatus as set forth in claim 2, wherein said given frequency is such that the time T' required to count a predetermined maximum number of steps is $T' = T \ln(1+\mu)$ seconds, where T is the time constant for said capacitor and said resistance means, and the binary representation of the number of steps counted by said encoder counting means and by said decoder counting means is the corresponding compressed pulse code modulation signal value.

4. Conversion apparatus as set forth in claim 3, wherein said input digital signal word includes a sign bit and a magnitude portion and wherein said decoder means includes means for initializing said decoder counting means to a predetermined count in accordance with said magnitude portion, said decoder counter means being decremented from said predetermined count starting at said initial time, said decoder control means being responsive to a zero count in said decoder counting means to change said switch means from said ON state to said Off state.

5. Conversion apparatus as set forth in claim 4, wherein said decoder means further includes decoder sample inverting means to derive an inverted signal which is substantially equal in magnitude and opposite in polarity to the potential of said decoder sample, and output electronic switch means operative in accordance with said sign bit to supply for a predetermined time duration an output analog signal directly from said sample whenever said sign bit indicates positive polarity and from said sample inverting means whenever said sign bit indicates negative polarity.

6. Conversion apparatus as set forth in claim 4, wherein, in said companding generator, said means to charge said capacitor to said first potential comprises first electronic switch means connected between a source of said first potential and the interconnection of said capacitor and said resistance means, and a buffer amplifier coupling said capacitor to said comparison means and said decoder sample and hold means.

7. Conversion apparatus as set forth in claim 6, wherein said decoder means includes a first operational amplifier having an input connected to the output of said decoder sample and hold means and operable to provide a signal which is substantially equal in magnitude and of the same polarity as the decoder sample at an output thereof, and a second operational amplifier having an input connected to resistive voltage dividing means which is connected between the output of said first operational amplifier and an output of said second operational amplifier and operable to invert the polarity of said decoder sample to provide a signal which is substantially equal in magnitude and opposite in polarity to said decoder sample at the output thereof, first and second output electronic switch means connected to the outputs of said first and second operational amplifiers respectively, a bistable device for storing the sign bit of said input compressed-pulse-coded digital signal words, and wherein said decoder control means includes means connected to said bistable device to enable either said first or second electronic switch means dependent on the sign bit from said bistable device to supply said output analog signal from said first and second operational amplifier, respectively.

8. Conversion apparatus as set forth in claim 6, wherein said encoder means includes encoder sample and hold means to sample said analog input signal and to hold the potential thereof as said encoder sample of the potential of said analog signal value.

9. Conversion apparatus as set forth in claim 8, wherein said encoder means further includes sample inverting means coupled to said sample and hold means to derive an inverted signal which is substantially equal in magnitude and opposite in polarity to said encoder sample, and wherein said comparison means comprises a first and a second comparator, said capacitor of said companding generator being coupled to an input of each of said comparators, said encoder sample and hold means being coupled to a further input of said first comparator, and said inverting means being coupled to a further input of said second comparator, so that said comparison output signal is provided by either said first or said second comparator depending upon whether said sample is of the same or the opposite polarity, respectively, with respect to said first potential, and sign bit means coupled to said comparison means and settable by said comparison output signal to a state corresponding to the one of said first and second comparators which produces said comparison output signal.

10. Conversion apparatus as set forth in claim 9, wherein said encoder means includes a first operational amplifier coupling said sample and hold means to said first comparator, said sample inverting means comprises a second operational amplifier having an input connected to resistive voltage divider means which is connected between outputs of said first and second operational amplifiers, and wherein said first and second comparators each comprise an operational amplifier.

11. In a conversion apparatus for relating a digital compressed pulse code modulation signal to an analog signal value in accord with a predetermined logarithmic companding law, an encoder means including encoder counting means, a decoder means including decoder counting means, and a companding generator common to said encoder means and said decoder means, said companding generator including a capacitor and resistance means connected in series, means for charging said capacitor to a first potential of a first polarity during a sampling period and effective at the start of said period for discharging said capacitor through said resistance means toward a second potential of the opposite polarity to provide a decreasing potential on said capacitor, means effective at the start of said period to step both said encoder counting means and said decoder counting means, said encoder means including sampling means for sampling an analog input signal during said sampling period to provide an encoder analog signal sample, comparison means for comparing said encoder analog signal sample with the potential on said capacitor during said period and for inhibiting further stepping of said encoder counting means when the potential of said encoder analog signal sample equals the potential on said capacitor whereby said encoder counting means provides magnitude bits for a digital compressed pulse code modulation signal representing the amplitude of said encoder analog signal sample, said decoder means including sample and hold means for tracking the potential on said capacitor during said holding period and for holding a decoder analog signal sample of an amplitude indicated by magnitude bits of a digital compressed pulse code modulation signal when the decoder counting means has counted a number of steps determined by the magnitude bits of said digital compressed pulse code modulation signal, and wherein said predetermined logarithmic companding law is the $\mu$-law, said first potential is equal to the full-scale potential of said analog signal value, and said second potential is equal to the negative of said first potential divided by the value of $\mu$ for said $\mu$-law.

12. A method of relating a digital compressed pulse code modulation signal to an analog signal value in accordance with a predetermined logarithmic companding law, comprising the steps of initially charging a capacitor to a first potential of a first polarity, then discharging the capacitor through a resistance means toward a second potential of a second polarity thereby providing a decreasing potential on the capacitor, simultaneously measuring first and second intervals of time by stepping first and second counting means at a given frequency starting at the beginning of the discharge of the capacitor, using the potential on the capacitor to encode a sample of an analog signal value with a digital value by permitting said first counting means to count until the absolute value of the potential on the capacitor equals the absolute value of said analog signal sample, and using the potential on the capacitor to simultaneously decode a digital value of an analog signal sample by tracking the potential on said capacitor as said capacitor discharges, and holding an analog signal sample equal in magnitude to the potential on said capacitor when the second counting means has counted a number of steps determined by an input digital signal word, said first and second potentials and the relation of said given frequency to the time constant of said capacitor and said resistance being chosen in accordance with said predetermined logarithmic companding law such that the binary representation of the number of steps counted by said first and second counting means during corresponding time intervals is a simple function of said compressed pulse code modulation signal value except for the sign bit, and wherein said predetermined logarithmic companding law is the $\mu$-law, said first potential is equal to the full-scale potential of said analog signal value, and said second potential is equal to the negative of said first potential divided by the value of $\mu$ for said $\mu$-law.

13. A method as set forth in claim 12, wherein said given frequency is such that the time $T'$ required to count a predetermined maximum number of steps is $T' = T \ln(1+\mu)$ seconds where T is the time constant for said capacitor and said resistance, and the number of steps advanced by either one of said counting means during the corresponding interval of time is the complement of said compressed pulse code modulation signal value.

* * * * *